United States Patent
Liang et al.

(10) Patent No.: US 11,715,523 B2
(45) Date of Patent: Aug. 1, 2023

(54) MEMORY DEVICE AND PROGRAM OPERATION THEREOF

(71) Applicant: YANGTZE MEMORY TECHNOLOGIES CO., LTD., Wuhan (CN)

(72) Inventors: Ke Liang, Wuhan (CN); Yueping Li, Wuhan (CN); Chunyuan Hou, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 172 days.

(21) Appl. No.: 17/384,047

(22) Filed: Jul. 23, 2021

(65) Prior Publication Data
US 2022/0301626 A1    Sep. 22, 2022

Related U.S. Application Data

(63) Continuation of application No. PCT/CN2021/082034, filed on Mar. 22, 2021.

(51) Int. Cl.
*G11C 16/34* (2006.01)
*G11C 16/10* (2006.01)
*G11C 16/04* (2006.01)
*G11C 11/56* (2006.01)

(52) U.S. Cl.
CPC .......... *G11C 16/10* (2013.01); *G11C 16/0483* (2013.01); *G11C 16/3459* (2013.01); *G11C 11/5628* (2013.01); *G11C 11/5671* (2013.01)

(58) Field of Classification Search
USPC .................................................. 365/185.22
See application file for complete search history.

(56) References Cited

U.S. PATENT DOCUMENTS

| 2016/0071601 A1 | 3/2016 | Shirakawa et al. |
| 2017/0242632 A1* | 8/2017 | Cho ............... G06F 16/902 |

FOREIGN PATENT DOCUMENTS

| CN | 103366818 A | 10/2013 |
| CN | 109785879 A | 5/2019 |
| CN | 110299172 A | 10/2019 |
| CN | 111798910 A | 10/2020 |

OTHER PUBLICATIONS

International Search Report issued in corresponding International Application No. PCT/CN2021/082034, dated Dec. 21, 2021, 4 pages.

* cited by examiner

*Primary Examiner* — Jason Lappas
(74) *Attorney, Agent, or Firm* — Bayes PLLC

(57) ABSTRACT

In certain aspects, a memory device includes a memory cell array having rows of memory cells, word lines respectively coupled to the rows of memory cells, and a peripheral circuit coupled to the memory cell array through the word lines. The peripheral circuit is configured to program a row of memory cells using a first program voltage and verify the programmed row of memory cells using a verify voltage and a sample voltage smaller than the verify voltage. The peripheral circuit is also configured to obtain a first number of memory cells of the programmed row of memory cells based on the sample voltage. The peripheral circuit is further configured to predict, based on the first number of memory cells and the sample voltage, a second number of memory cells of the programmed row of memory cells that fail to pass the verification.

20 Claims, 13 Drawing Sheets

MEMORY DEVICE AND PROGRAM OPERATION THEREOF

CROSS-REFERENCE TO RELATED APPLICATIONS

This application is continuation of International Application No. PCT/CN2021/082034, filed on Mar. 22, 2021, entitled "MEMORY DEVICE AND PROGRAM OPERATION THEREOF," which is hereby incorporated by reference in its entirety.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, to change the threshold voltage of each memory cell to a desired level. For NAND Flash memory, an erase operation can be performed at the block level, a program operation can be performed at the page level, and a read operation can be performed at the cell level.

SUMMARY

In one aspect, a memory device includes a memory cell array having rows of memory cells, word lines respectively coupled to the rows of memory cells, and a peripheral circuit coupled to the memory cell array through the word lines. The peripheral circuit is configured to program a row of memory cells using a first program voltage and verify the programmed row of memory cells using a verify voltage and a sample voltage smaller than the verify voltage. The peripheral circuit is also configured to obtain a first number of memory cells of the programmed row of memory cells based on the sample voltage. The peripheral circuit is further configured to predict, based on the first number of memory cells and the sample voltage, a second number of memory cells of the programmed row of memory cells that fail to pass the verification.

In another aspect, a system includes a memory device configured to store data and a memory controller coupled to the memory device and configured to control the memory device. The memory device includes a memory cell array having rows of memory cells, word lines respectively coupled to the rows of memory cells, and a peripheral circuit coupled to the memory cell array through the word lines. The peripheral circuit is configured to program a row of memory cells using a first program voltage and verify the programmed row of memory cells using a verify voltage and a sample voltage smaller than the verify voltage. The peripheral circuit is also configured to obtain a first number of memory cells of the programmed row of memory cells based on the sample voltage. The peripheral circuit is further configured to predict, based on the first number of memory cells and the sample voltage, a second number of memory cells of the programmed row of memory cells that fail to pass the verification.

In still another aspect, a method for operating a memory device is provided. The memory device includes a memory cell array having a plurality of rows of memory cells, and a plurality of word lines respectively coupled to the plurality of rows of memory cells. A row of memory cells of the plurality of rows of memory cells is programmed using a first program voltage. The programmed row of memory cells is verified using a verify voltage and a sample voltage smaller than the verify voltage. A first number of memory cells of the programmed row of memory cells is obtained based on the sample voltage. A second number of memory cells of the programmed row of memory cells that fail to pass the verification is predicted based on the first number of memory cells and the sample voltage.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
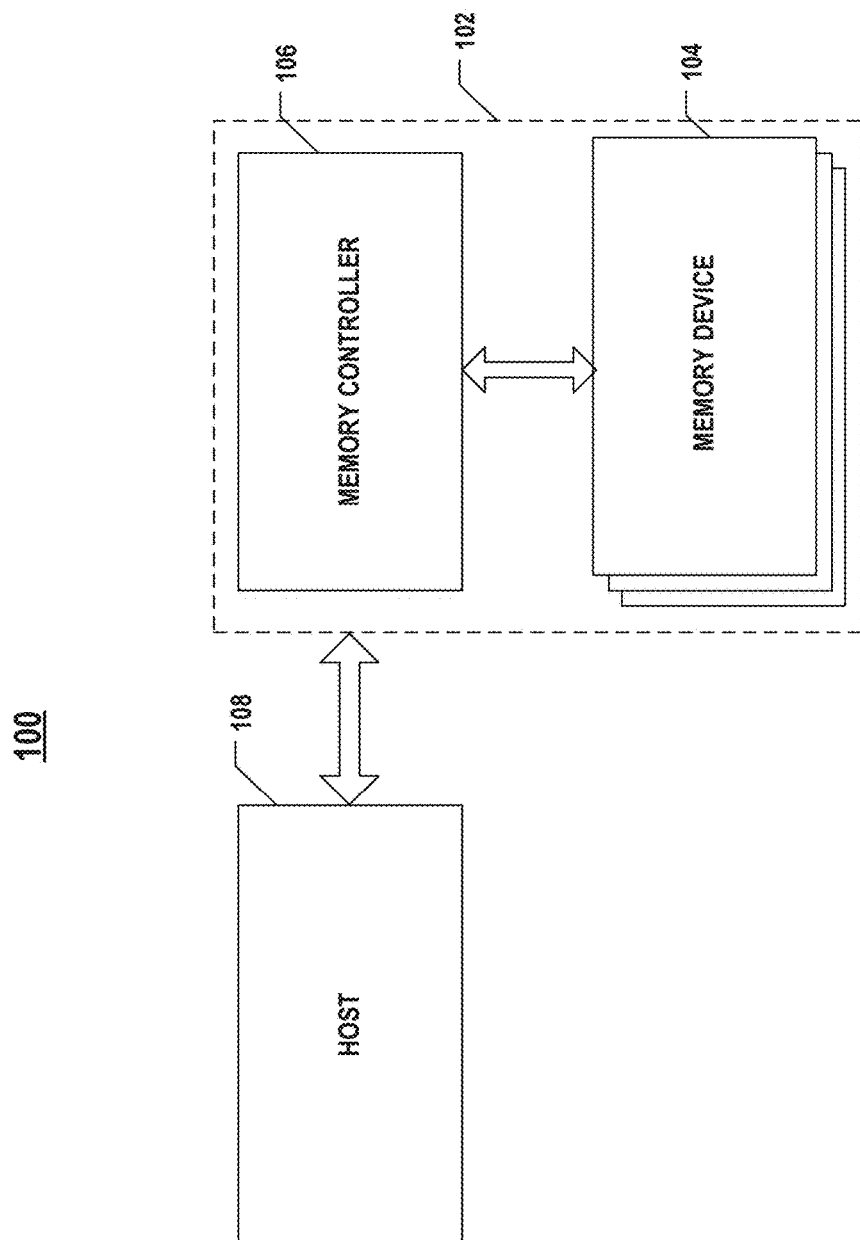
FIG. 1 illustrates a block diagram of an exemplary system having a memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory devices, such as NAND Flash memory devices, can store more than a single bit of information into each memory cell with multiple states in order to increase the storage capacity and reduce the cost per bit. In program operations, the data may be first programmed (written) into single-level cell (SLC) blocks and later combined into xLC blocks, such as multi-level cell (MLC) blocks, trip-level cell (TLC) blocks, quad-level cell (QLC) blocks, etc., in order to save program time. Thus, the program speed of SLCs becomes important for memory devices having xLCs. To speed up the SLC program operations, a smaller number of program/verify cycles is desired, which in turn requires a higher program voltage to ensure that all the programmed memory cells can reach the expected threshold voltages.

However, a higher program voltage also increases the width threshold distribution of memory cells in the programmed state, which is undesirable for read operations. On the other hand, reducing the program voltage may result in a large number of memory cells that fail to pass the verification after applying the first program voltage, thereby requiring the increase of the capability to count those memory cells (a.k.a., verify count (VFC) criteria). As a result, the power consumption, die size, and error rate may be increased due to the higher VFC criteria.

To address the aforementioned issues, the present disclosure introduces a solution that balances the width of threshold voltage distribution and the VFC criteria in program operations with a limited number of program/verify cycles. Consistent with the scope of the present disclosure, the total number of memory cells that fail to pass the verification can be predicted based on a portion of the total number of memory cells defined by a set of smaller verify voltages (known as "sample voltages" herein) using a threshold voltage distribution model (e.g., following a normal distribution). Since the number of memory cells that is actually counted becomes smaller, the power consumption, die size, and the error rate can be reduced compared with the known solutions. In some implementations, the verification after applying the first program voltage includes one or more sample voltages after the verify voltage to define a narrower verify range (i.e., smaller VFC criteria) in order to reduce the number of memory cells within the range that need to be counted. In some implementations, a threshold voltage distribution model, which is built up, for example, using silicon test data, is obtained based on the first program voltage and is used to predict the actual number of verification-failed memory cells based on the smaller sample number of verification-failed memory cells.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. As disclosed below in detail, memory device 104, such as a NAND Flash memory device, can predict the actual number of verification-failed memory cells based on a smaller sample number of verification-failed memory cells in program operations. Consistent with the scope of the present disclosure, in a program operation, memory device 104 can apply one or more sample voltages after applying the verify voltage in a program/verify cycle to define a narrower verify range (i.e., a smaller VFC criteria) for counting the verification-failed memory cells and estimate the actual number of verification-failed memory cells in the program/verify cycle based on the sample number using a threshold voltage distribution model.

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
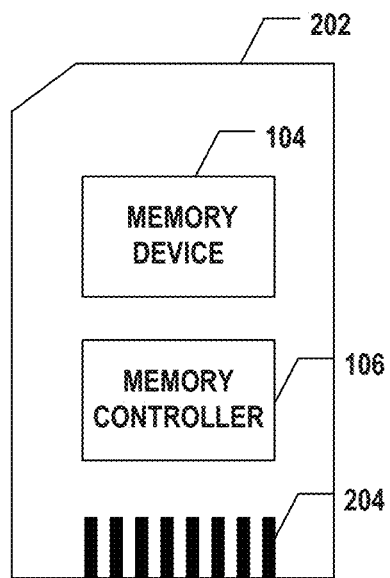
FIG. 2A illustrates a diagram of an exemplary memory card having a memory device, according to some aspects of the present disclosure.
Figure 2B:
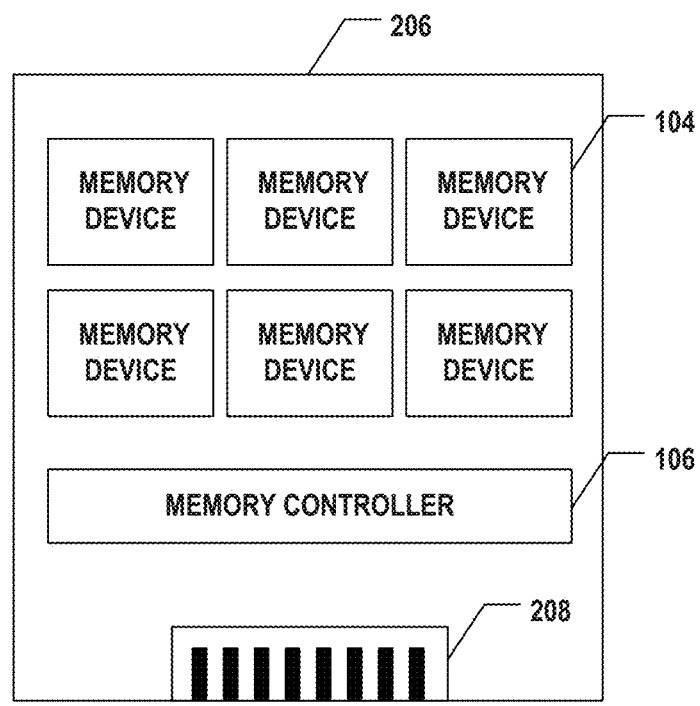
FIG. 2B illustrates a diagram of an exemplary solid-state drive (SSD) having a memory device, according to some aspects of the present disclosure.

Memory controller 106 and one or more memory devices 104 can be integrated into various types of storage devices, for example, being included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
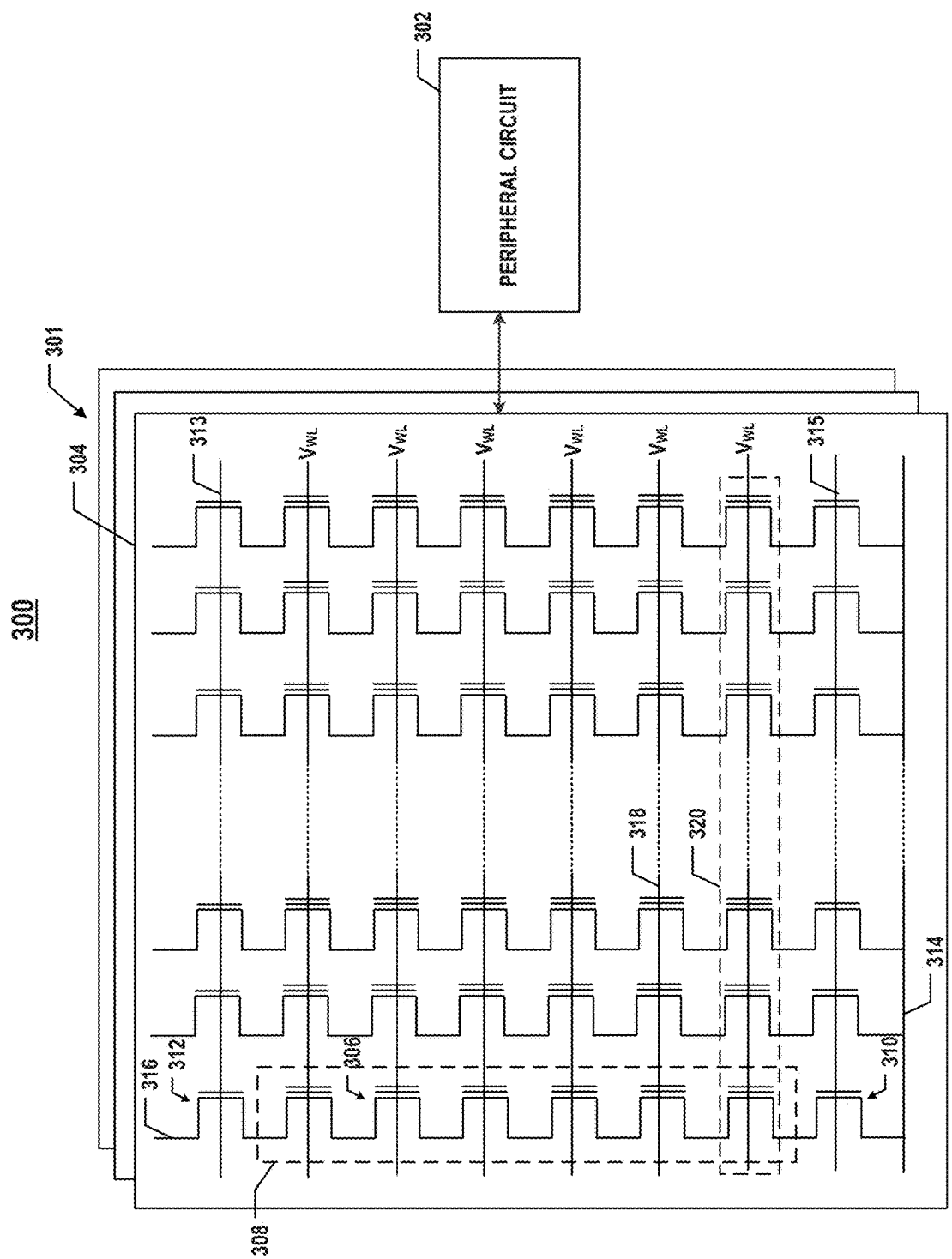
FIG. 3 illustrates a schematic diagram of an exemplary memory device including peripheral circuits, according to some aspects of the present disclosure.

FIG. 3 illustrates a schematic circuit diagram of an exemplary memory device 300 including peripheral circuits, according to some aspects of the present disclosure. Memory device 300 can be an example of memory device 104 in FIG. 1. Memory device 300 can include a memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, that depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 is an SLC that has two possible memory states and thus, can store one bit of data. For example, the first memory state "0" can correspond to a first range of voltages, and the second memory state "1" can correspond to a second range of voltages. In some implementations, each memory cell 306 is an xLC that is capable of storing more than a single bit of data in more than four memory states. For example, the xLC can store two bits per cell (MLC), three bits per cell (TLC), or four bits per cell (QLC)). Each xLC can be programmed to assume a range of possible nominal storage values. In one example, the MLC can be programmed to assume one of three possible programming levels from an erased state by writing one of three possible nominal storage values to the cell. A fourth nominal storage value can be used for the erased state.

As shown in FIG. 3, each NAND memory string 308 can also include a source select gate (SSG) transistor 310 at its source end and a drain select gate (DSG) transistor 312 at its drain end. SSG transistor 310 and DSG transistor 312 can be configured to activate selected NAND memory strings 308 (columns of the array) during read and program operations. In some implementations, the sources of NAND memory strings 308 in the same block 304 are coupled through a same source line (SL) 314, e.g., a common SL. In other words, all NAND memory strings 308 in the same block 304 have an array common source (ACS), according to some implementations. The drain of each NAND memory string 308 is coupled to a respective bit line 316 from which data can be read or written via an output bus (not shown), according to some implementations. In some implementations, each NAND memory string 308 is configured to be selected or deselected by applying a select voltage or a deselect voltage to the gate of respective DSG transistor 312 through one or more DSG lines 313 and/or by applying a select voltage or a deselect voltage to the gate of respective SSG transistor 310 through one or more SSG lines 315.

As shown in FIG. 3, NAND memory strings 308 can be organized into multiple blocks 304, each of which can have a common source line 314, e.g., coupled to the ACS. In some implementations, each block 304 is the basic data unit for erase operations, i.e., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). Memory cells 306 of adjacent NAND memory strings 308 can be coupled through word lines 318 that select which row of memory cells 306 is affected by read and program operations. In some implementations, each word line 318 is coupled to a page 320 of memory cells 306, which is the basic data unit for program operations. The size of one page 320 in bits can relate to the number of NAND memory strings 308 coupled by word line 318 in one block 304. Each word line 318 can include a plurality of control gates (gate electrodes) at each memory cell 306 in respective page 320 and a gate line coupling the control gates.

Figure 4:
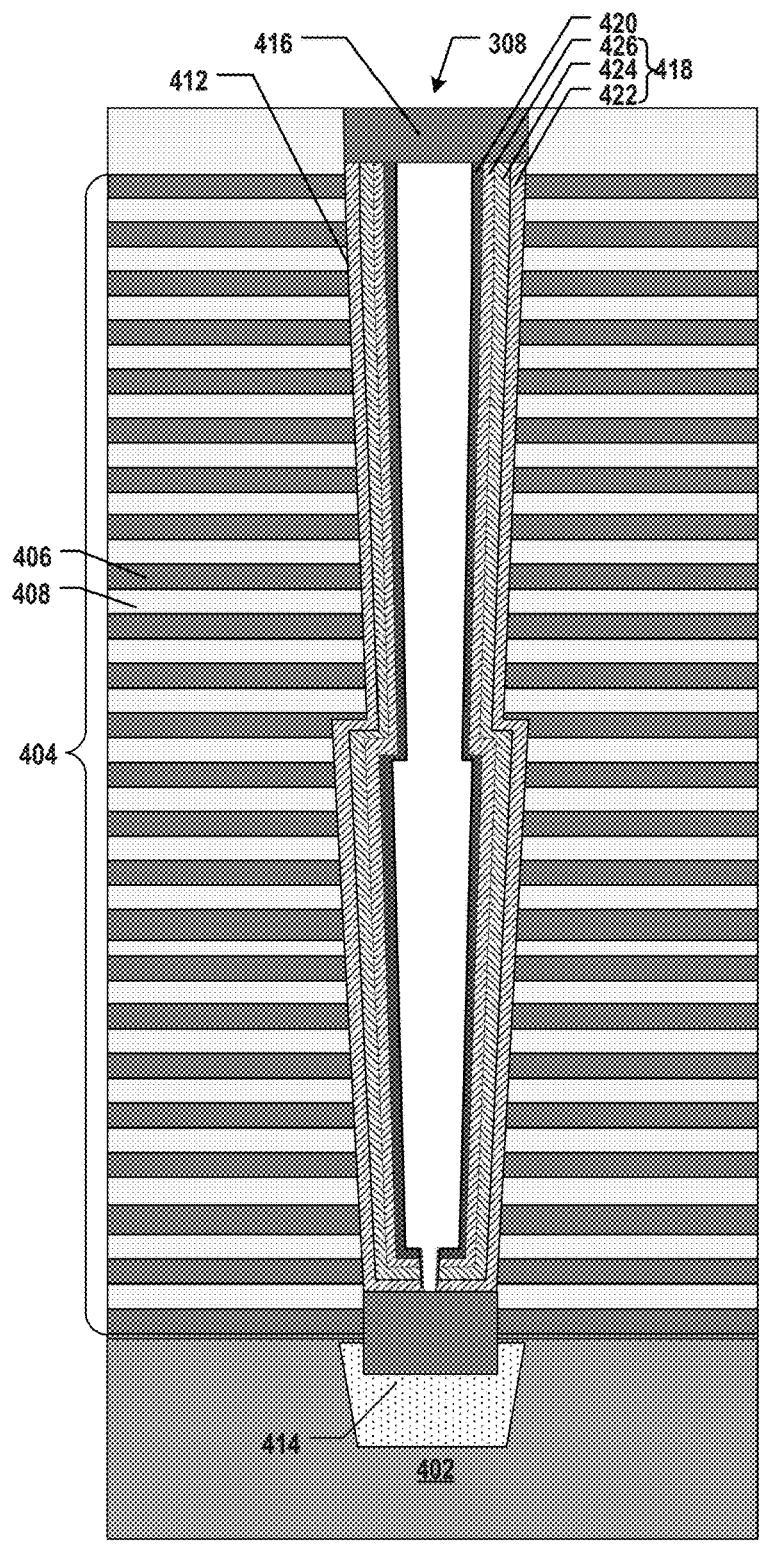
FIG. 4 illustrates a side view of a cross-section of an exemplary memory cell array including a NAND memory string, according to some aspects of the present disclosure.

FIG. 4 illustrates a side view of a cross-section of exemplary memory cell array 301 including NAND memory string 308, according to some aspects of the present disclosure. As shown in FIG. 4, NAND memory string 308 can extend vertically through a memory stack 404 above a substrate 402. Substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 404 can include interleaved gate conductive layers 406 and gate-to-gate dielectric layers 408. The number of the pairs of gate conductive layers 406 and gate-to-gate dielectric layers 408 in memory stack 404 can determine the number of memory cells 306 in memory cell array 301. Gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. Each gate conductive layer 406 can include control gates surrounding memory cells 306, the gates of DSG transistors 312, or the gates of SSG transistors 310, and can extend laterally as DSG line 313 at the top of memory stack 404, SSG line 315 at the bottom of memory stack 404, or word line 318 between DSG line 313 and SSG line 315.

As shown in FIG. 4, NAND memory string 308 includes a channel structure 412 extending vertically through memory stack 404. In some implementations, channel structure 412 includes a channel hole filled with semiconductor material(s) (e.g., as a semiconductor channel 420) and dielectric material(s) (e.g., as a memory film 418). In some implementations, semiconductor channel 420 includes silicon, such as polysilicon. In some implementations, memory film 418 is a composite dielectric layer including a tunneling layer 426, a storage layer 424 (also known as a "charge trap/storage layer"), and a blocking layer 422. Channel structure 412 can have a cylinder shape (e.g., a pillar shape). Semiconductor channel 420, tunneling layer 426, storage layer 424, blocking layer 422 are arranged radially from the center toward the outer surface of the pillar in this order, according to some implementations. Tunneling layer 426 can include silicon oxide, silicon oxynitride, or any combination thereof. Storage layer 424 can include silicon nitride, silicon oxynitride, silicon, or any combination thereof. Blocking layer 422 can include silicon oxide, silicon oxynitride, high dielectric constant (high-k) dielectrics, or any combination thereof. In one example, memory film 418 may include a composite layer of silicon oxide/silicon oxynitride/silicon oxide (ONO).

As shown in FIG. 4, a well 414 (e.g., a P-well and/or an N-well) is formed in substrate 402, and the source end of NAND memory string 308 is in contact with well 414, according to some implementations. For example, source line 314 may be coupled to well 414 to apply an erase voltage to well 414, i.e., the source of NAND memory string 308, during erase operations. In some implementations, NAND memory string 308 further includes a channel plug 416 at the drain end of NAND memory string 308. It is understood that although not shown in FIG. 4, additional components of memory cell array 301 can be formed including, but not limited to, gate line slits/source contacts, local contacts, interconnect layers, etc.

Figure 5:
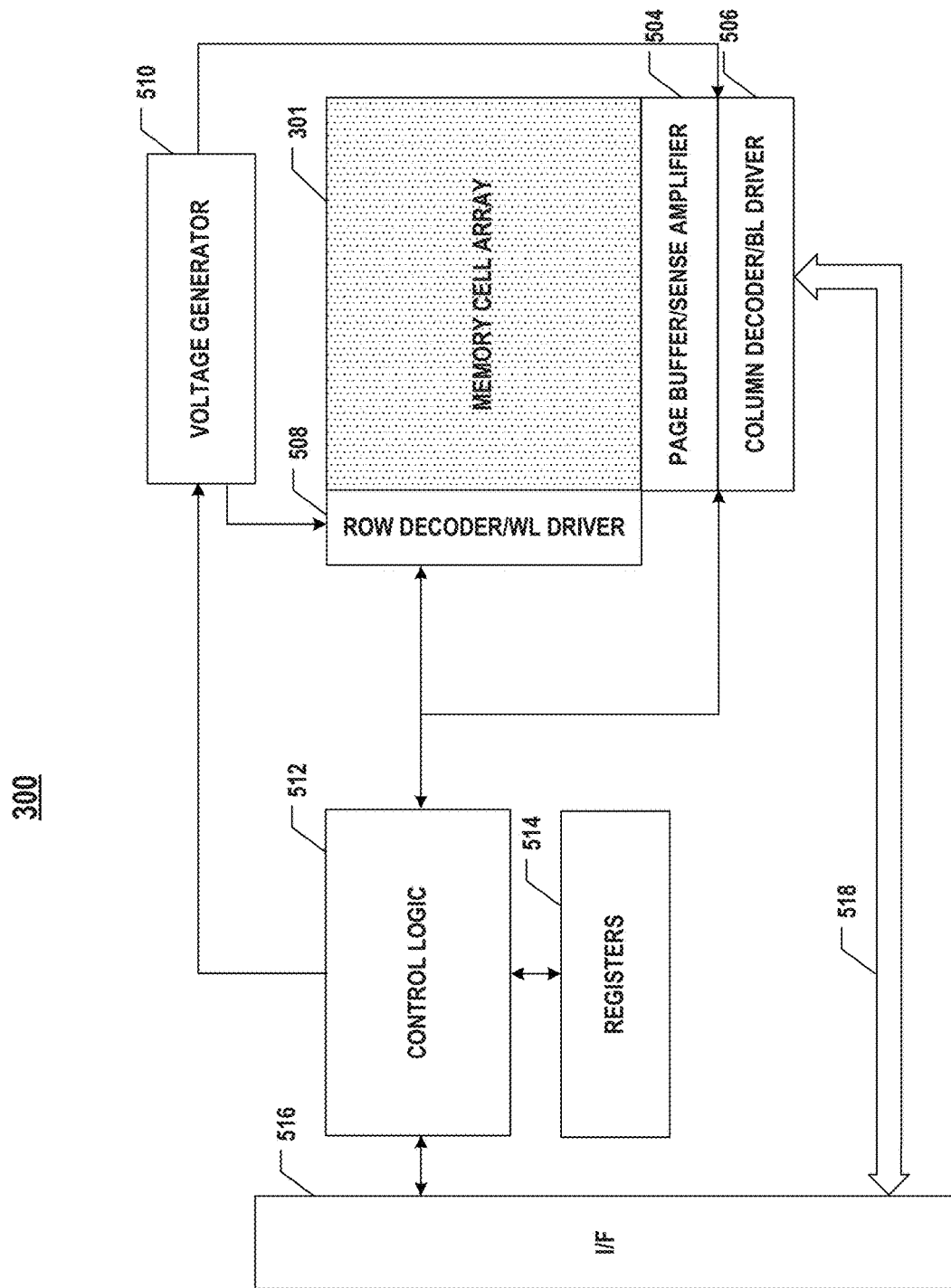
FIG. 5 illustrates a block diagram of an exemplary memory device including a memory cell array and peripheral circuits, according to some aspects of the present disclosure.

Referring back to FIG. 3, peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313. Peripheral circuits 302 can include various types of peripheral circuits formed using metal-oxide-semiconductor (MOS) technologies. For example, FIG. 5 illustrates some exemplary peripheral circuits including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store one page of program data (write data) to be programmed into one page 320 of memory cell array 301. In another example, page buffer/sense amplifier 504 may verify programmed target memory cells 306 in each program/verify cycle in a program operation to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. As described below in detail, in program operations, page buffer/sense amplifier 504 can include modules for recording and counting the number of memory cells 306 that fail to pass the verification, i.e., verification-failed memory cell number, in each program/verify cycle. Consistent with the scope of the present disclosure, in some implementations, page buffer/sense amplifier 504 obtains the verification-failed memory cell number based on a narrower verify range (i.e., smaller VFC criteria) defined by a set of sample voltages smaller than the verify voltage, such that the power consumption and size of page buffer/sense amplifier 504 can be reduced.

Column decoder/bit line driver 506 can be configured to be controlled by control logic 512 and select one or more NAND memory strings 308 by applying bit line voltages generated from voltage generator 510. Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some implementations, row decoder/word line driver 508 can also select/deselect and drive SSG lines 315 and DSG lines 313 as well.

Voltage generator 510 can be configured to be controlled by control logic 512 and generate the word line voltages (e.g., read voltage, program voltage, channel pass voltage, local voltage, verify voltage, etc.), bit line voltages, and source line voltages to be supplied to memory cell array 301. As described below in detail, voltage generator 510 can also generate one or more sample voltages applied to selected word line 318 after the verify voltage in program operations when verifying programmed target memory cells 306. For example, each sample voltage may be smaller than the verify voltage.

Control logic 512 can be coupled to each peripheral circuit described above and configured to control the operations of each peripheral circuit. Registers 514 can be coupled to control logic 512 and include status registers, command registers, and address registers for storing status information, command operation codes (OP codes), and command addresses for controlling the operations of each peripheral circuit. Interface 516 can be coupled to control logic 512 and act as a control buffer to buffer and relay control commands received from a host (e.g., 108 in FIG. 1) to control logic 512 and status information received from control logic 512 to the host. Interface 516 can also be coupled to column decoder/bit line driver 506 via data bus 518 and act as a data input/output (I/O) interface and a data buffer to buffer and relay the data to and from memory cell array 301.

Figure 6:
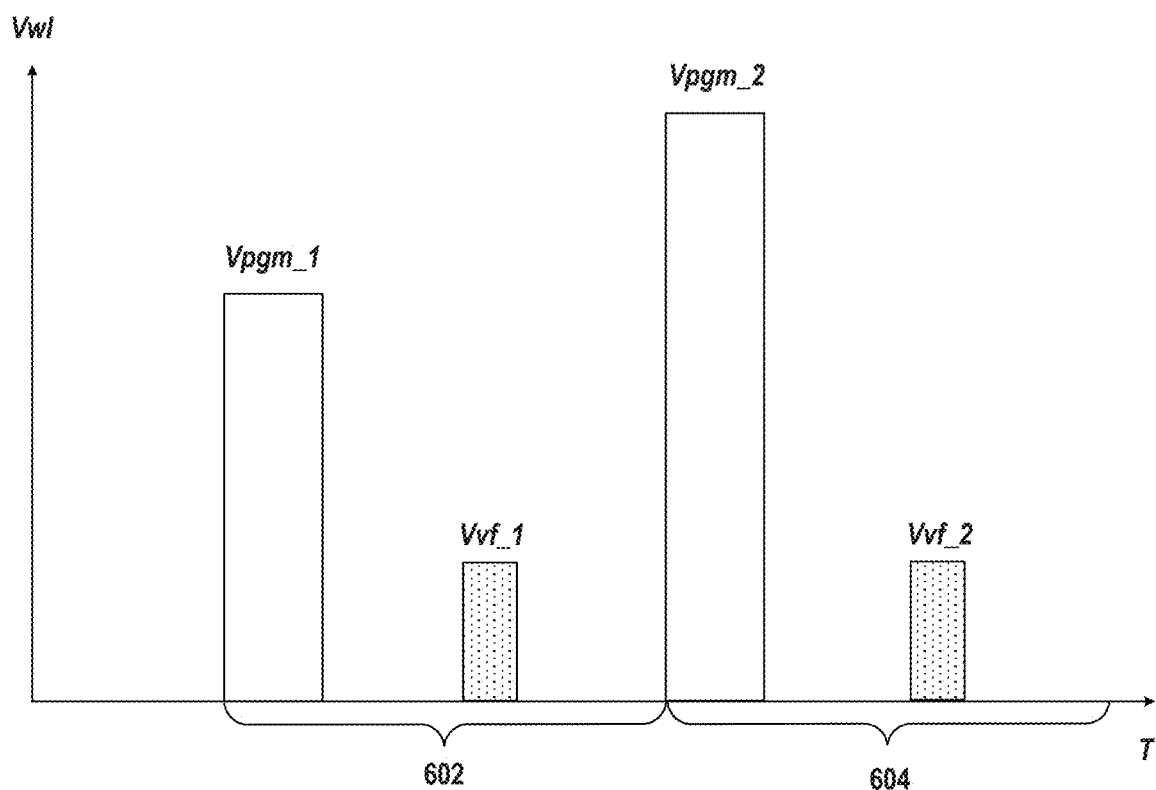
FIG. 6 illustrates a waveform of word line voltages applied to a selected word line in a program operation.
Figure 7A:
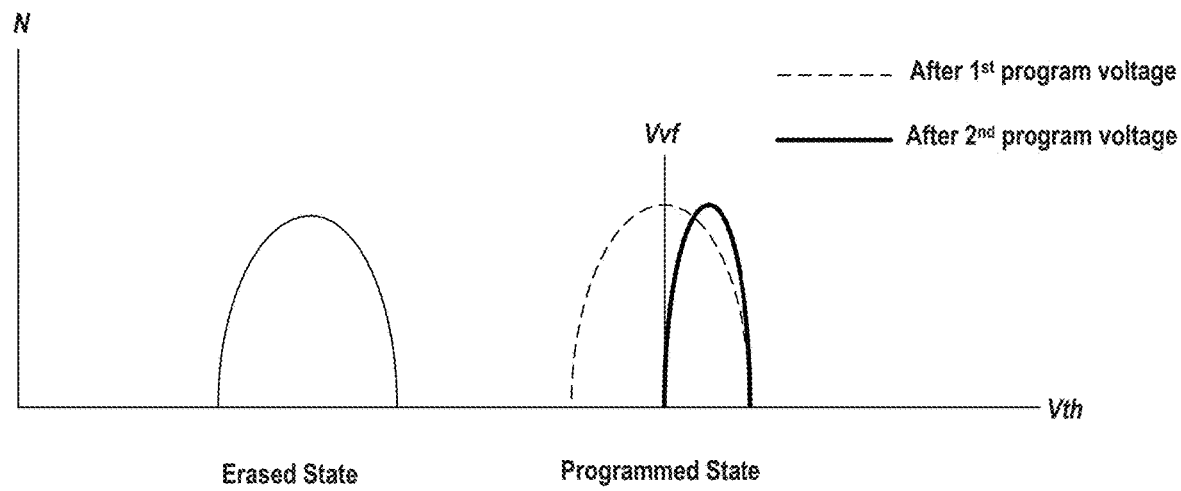
FIGS. 7A and 7B illustrate threshold voltage distributions of memory cells in program operations.
Figure 7B:
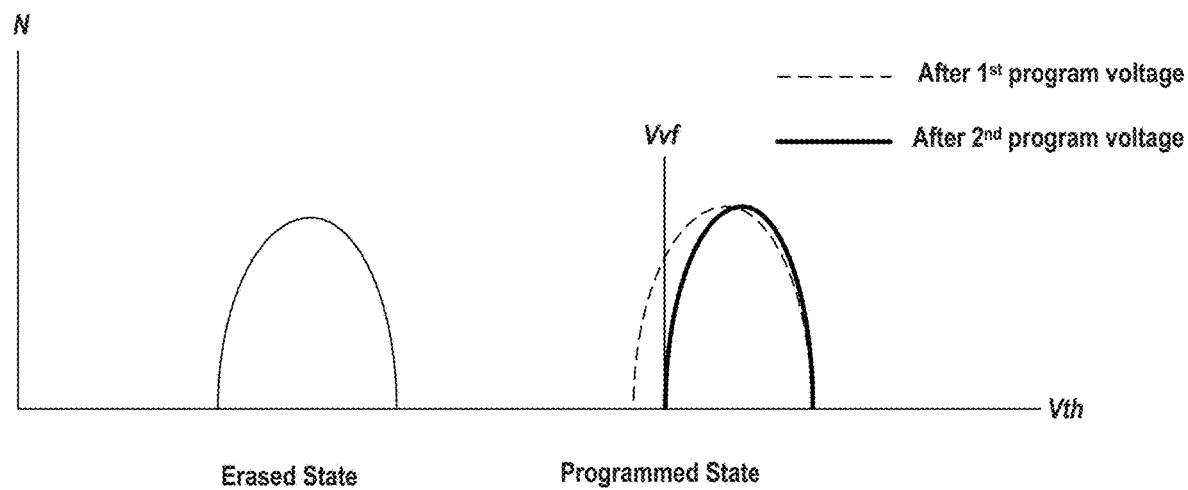

FIG. 6 illustrates a waveform of word line voltages Vw1 applied to a selected word line in a program operation. FIGS. 7A and 7B illustrate threshold voltage distributions of memory cells in program operations. As shown in FIG. 6, to program the memory cells coupled to a selected word line, a plurality of program/verify cycles are included in the program operation in sequence, such as a first program/verify cycle 602 and a second program/verify cycle 604. Starting the program operation, in first program/verify cycle 602, a first program voltage Vpgm_1 (e.g., a voltage pulse signal, a.k.a., a program pulse) is applied to the selected word line to program the memory cells coupled to the selected word line, followed by applying a first verify voltage Vvf_1 to check whether the threshold voltage each programmed memory cell reaches the first verify voltage. If one or more memory cells (verification-failed memory cells)

fail to pass the verification, i.e., their threshold voltages are below the first verify voltage, second program/verify cycle 604 is then applied on the verification-failed memory cells with an increased second program voltage Vpgm_2. Additional program/verify cycle(s) may be applied if there are still memory cells that fail to pass the second verify voltage Vvf_2.

As shown in FIGS. 7A and 7B, after applying the first program voltage in first program/verify cycle 602, the threshold voltage Vth distribution (dashed line) of the memory cells coupled to the selected word line are raised from the erased state up to the programmed state. The threshold voltage distributions in the programmed state vary depending on the level of the first program voltage. For example, FIG. 7B shows a threshold voltage distribution at a higher threshold voltage level than FIG. 7A because the voltage level of the first program voltage in FIG. 7B is higher than that in FIG. 7A. By applying the same verify voltage Vvf, the verification-failed memory cell number in FIG. 7A becomes larger than the verification-failed memory cell number in FIG. 7B. In other words, the threshold voltage distribution after the first program voltage in FIG. 7B has a narrower verify range (i.e., a smaller VFC criteria) than that in FIG. 7A. However, after applying the second program voltage (assuming all the memory cells now reach the verify voltage), the final threshold voltage distribution (solid line) in FIG. 7A has a smaller width (narrower) than that in FIG. 7B.

By comparing FIGS. 7A and 7B, it is noted that although a higher first program voltage can reduce the VFC criteria, which is more desirable due to less power consumption, die size, and verify error rates, the final threshold voltage distribution in the programmed state is less favorable due to its larger width, which can reduce the margin for read operations Conversely, a lower first program voltage can reduce the width of the final threshold voltage distribution, but also increase the VFC criteria, thereby causing more power, die size, and error rates in order to count more verification-failed memory cells. Moreover, as the additional program/verify cycle(s) in FIG. 6, e.g., applying the second verify voltage in second program/verify cycle 604, increase the program time and reduces the program speed, it is also desirable to skip the second verification after applying the second program voltage, which in turn requires a large voltage level increment from the first program voltage to the second program voltage to ensure that all the verification-failed memory cells can now reach the verify voltage.

To balance the needs of a narrower threshold voltage distribution and smaller VFC criteria, as described above with respect to FIGS. 6, 7A, and 7B, consistent with the scope of the present disclosure, instead of counting all the verification-failed memory cells, a portion of the verification-failed memory cells can be counted and used as the sample for predicting the actual verification-failed memory cell number. As a result, a smaller program voltage can be used to ensure that the final threshold voltage distribution has a smaller width without the concern of increasing the VFC criteria used for verification. To implement the solutions, for example, FIG. 8 illustrates a detailed block diagram of the exemplary peripheral circuits in FIG. 5, including control logic 512 and page buffer/sense amplifier 504, according to some aspects of the present disclosure.

Figure 8:
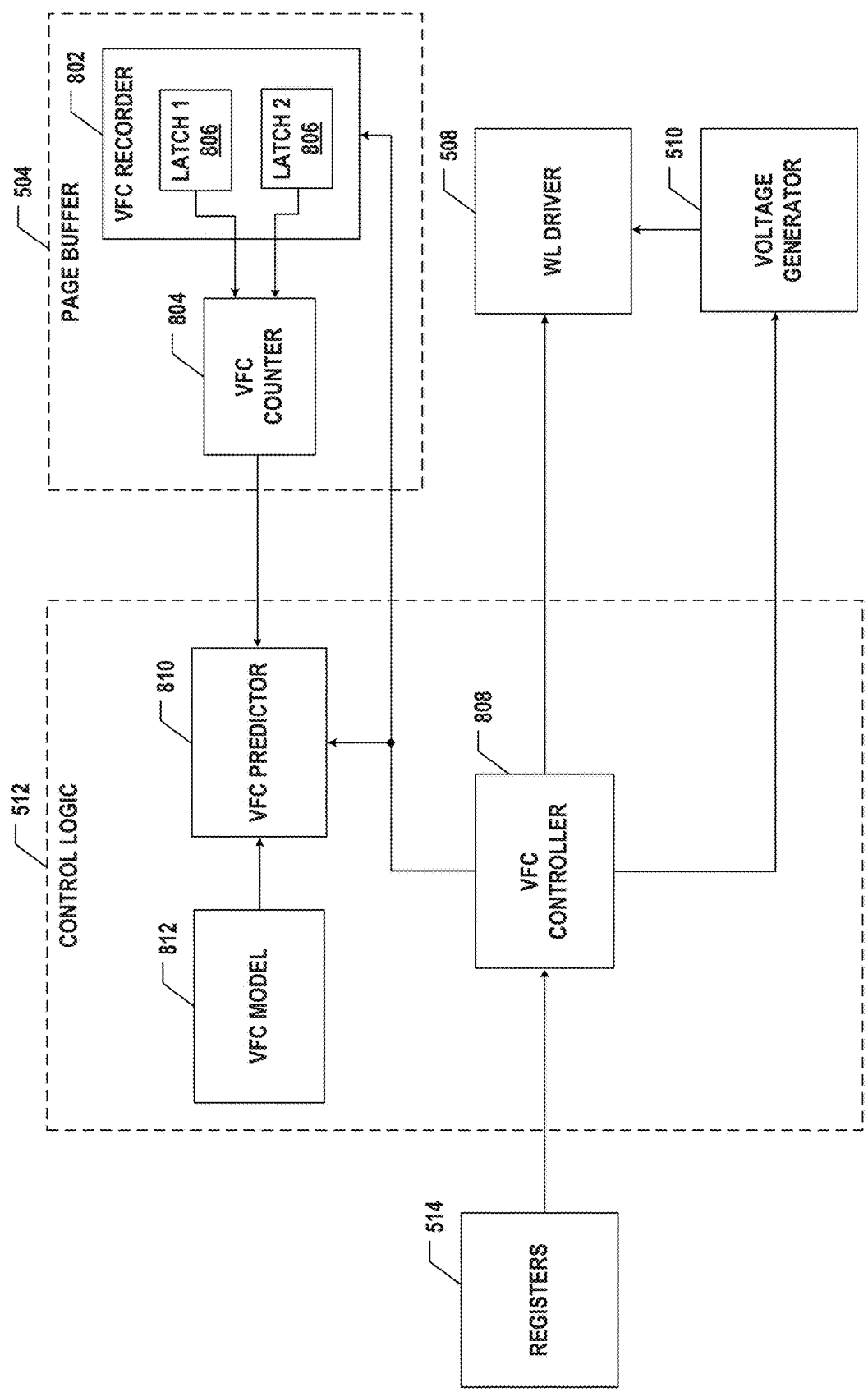
FIG. 8 illustrates a detailed block diagram of the exemplary peripheral circuits in FIG. 5, according to some aspects of the present disclosure.

As shown in FIGS. 3, 5, and 8, in some implementations, peripheral circuits 302, including control logic 512, row decoder/word line driver 508, voltage generator 510, page buffer/sense amplifier 504, registers 514, and any other suitable components (e.g., column decoder/bit line driver 506) work together to perform a program operation on memory cells 306 (e.g., SLCs) in memory cell array 301 coupled to a selected word line 318 (e.g., page 320). To perform the program operation, page buffer/sense amplifier 504 can include a VFC recorder 802 and a VFC counter 804, along with any other suitable components not shown in FIG. 8, such as data and cache latches. Each of VFC recorder 802 and VFC counter 804 can be a digital circuit, an analog circuit, and/or a mixed-signal circuit, as described below in more detail. To perform the program operation, control logic 512 can include a VFC controller 808 and a VFC predictor 810, along with any other suitable components not shown in FIG. 8, such as a processor (e.g., a microcontroller unit (MCU)) and a memory (e.g., random-access memory (RAM)). Each of VFC controller 808 and VFC predictor 810 can be implemented as a firmware module stored in the RAM and executed by the MCU. Each of VFC controller 808 and VFC predictor 810 can also be implemented as application-specific integrated circuits (ASICs), including a digital circuit, an analog circuit, and/or a mixed-signal circuit.

To perform the program operation, peripheral circuits 302 can be configured to first program a row of target memory cells 306 (e.g., SLCs in page 320) coupled to a selected word line 318 using a first program voltage. In some implementations, control logic 512 sends commands to voltage generator 510 to control voltage generator 510 to generate a first program voltage and provide the first program voltage to row decoder/word line driver 508. The voltage level of the first program voltage can be stored in registers 514 and retrieved by control logic 512. Control logic 512 can also send commands to row decoder/word line driver 508 to control row decoder/word line driver 508 to apply the first program voltage to selected word line 318. That is, row decoder/word line driver 508 can be configured to apply the first program voltage to selected word line 318 when programming the row of target memory cells 306.

Figure 9:
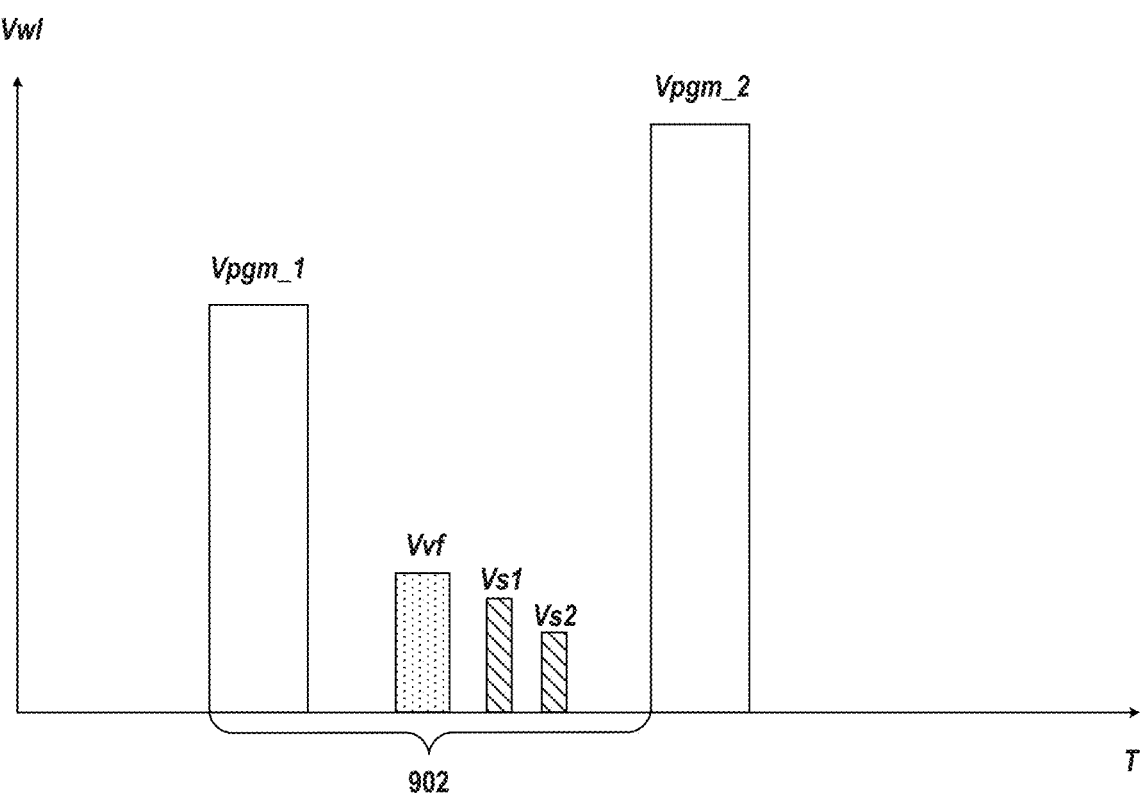
FIG. 9 illustrates a waveform of word line voltages applied to a selected word line in an exemplary program operation, according to some aspects of the present disclosure.
Figure 10:
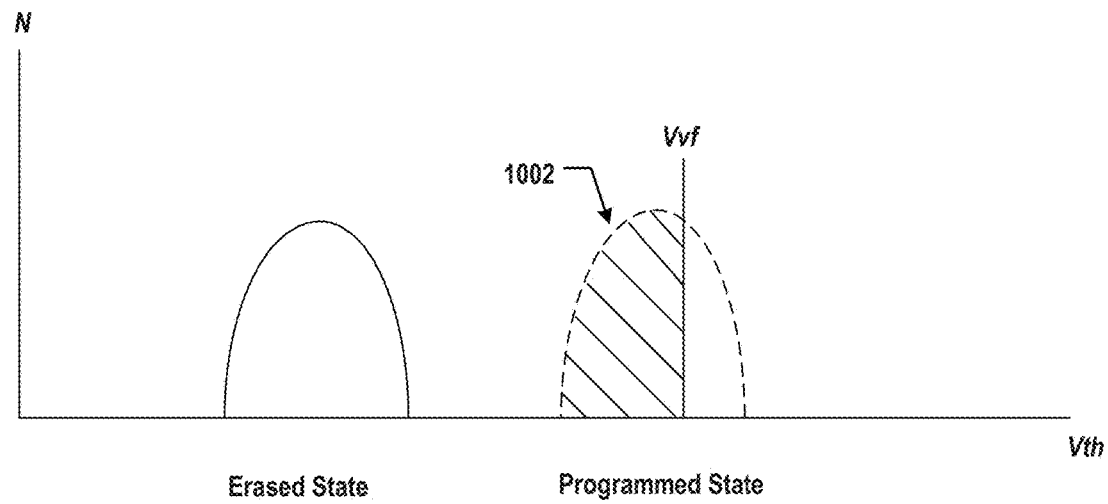
FIG. 10 illustrates threshold voltage distributions of memory cells in an exemplary program operation, according to some aspects of the present disclosure.
Figure 10:
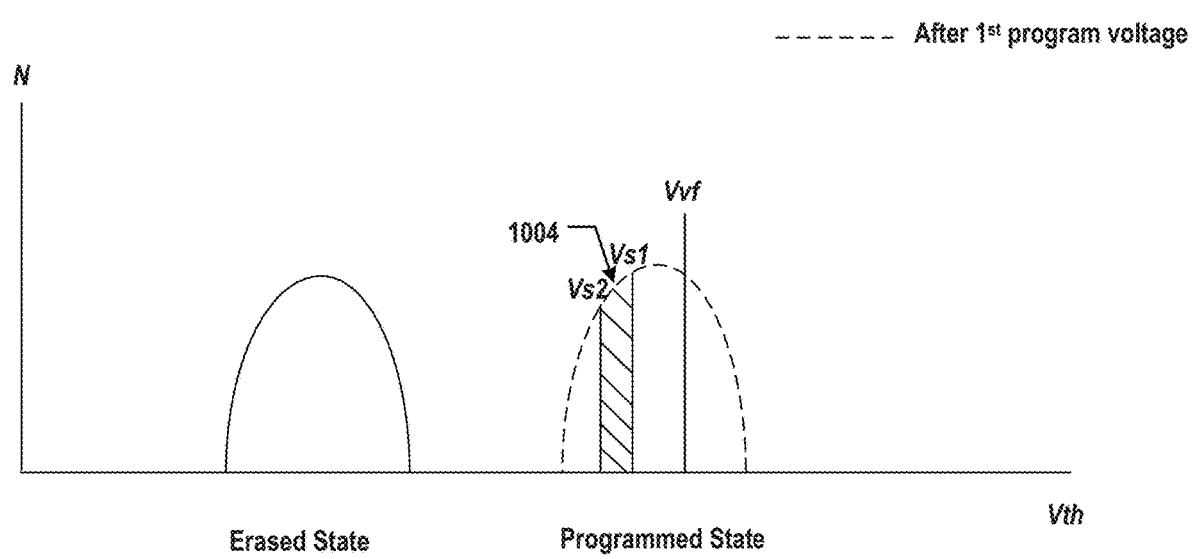

As shown in FIG. 9, for example, the first program voltage Vpgm_1, such as a voltage pulse signal, may be applied first as the first word line voltage Vw1 in a first program/verify cycle 902. The first program voltage can be applied to the control gates of each target memory cell 306 to program target memory cells 306. As shown in FIG. 10, for example, after applying the first program voltage, the threshold voltage Vth of each target memory cell 306 may be raised from the erased state to a programmed state. It is understood that the threshold voltage distribution of target memory cells 306 in the erased state or the programmed state may follow a normal distribution, as shown in FIG. 10. As described above, the level of the threshold voltages (e.g., the center of the threshold voltage distribution) in the programmed state depends on the voltage level of the first program voltage, which can eventually determine the final threshold voltage distribution (e.g., the width) of target memory cells 306, according to some implementations. Thus, control logic 512, in conjunction with registers 514, can use a suitable voltage level for the first program voltage to ensure that the desired final threshold voltage distribution (e.g., the width) of target memory cells 306 can be achieved.

To perform the program operation, peripheral circuits 302 can be configured to verify programmed row of memory cells 306 using a verify voltage and a sample voltage smaller than the verify voltage. In some implementations, VFC controller 808 of control logic 512 sends commands to voltage generator 510 to control voltage generator 510 to generate a verify voltage and one or more sample voltages, each of which is smaller than the verify voltage, and provide the verify voltage and sample voltage(s) to row decoder/ word line driver 508. The voltage levels of the verify voltage and sample voltage(s) can be stored in registers 514 and retrieved by VFC controller 808 of control logic 512. VFC controller 808 of control logic 512 can also send commands to row decoder/word line driver 508 to control row decoder/ word line driver 508 to sequentially apply the verify voltage and the sample voltage(s) to selected word line 318. That is, row decoder/word line driver 508 can be configured to sequentially apply the verify voltage and the sample voltage(s) to selected word line 318 when verifying the programmed row of target memory cells 306.

In some implementations, control logic 512 also sends commands to page buffer/sense amplifier 504 to check whether the threshold voltage of each programmed target memory cell 306 reaches the verify voltage after row decoder/word line driver 508 applying the verify voltage, and also to check whether the threshold voltage of each programmed target memory cell 306 reaches each sample voltage after row decoder/word line driver 508 applying each sample voltage. For example, page buffer/sense amplifier 504 may determine whether the threshold voltage of each programmed target memory cell 306 reaches a certain voltage by detecting the current flow through respective bit line 316 coupled to programmed target memory cell 306, i.e., indicating whether the voltage is equal to or greater than the threshold voltage to turn on respective programmed target memory cell 306. That is, page buffer/sense amplifier 504 can be configured to sequentially check whether the threshold voltage of each programmed target memory cell 306 reaches the verify voltage after row decoder/word line driver 508 applying the verify voltage, and whether the threshold voltage of each programmed target memory cell 306 reaches each sample voltage after row decoder/word line driver 508 applying each sample voltage.

As shown in FIG. 9, for example, the verify voltage Vvf, such as a voltage pulse signal that is smaller than the first program voltage Vpgm_1, may be applied as the second word line voltage Vw1 after the first program voltage in the first program/verify cycle 902. The verify voltage can be applied to the control gates of each target memory cell 306 to compare the threshold voltage of each programmed target memory cells 306 with the verify voltage by checking whether the verify voltage can turn on each programmed target memory cell 306. As shown in FIG. 10, the shaded area 1002 (defined by the verify voltage Vvf) of the threshold voltage distribution in the programmed state after the first program voltage may indicate all programmed target memory cells 306 that fail to pass the verification as their threshold voltages do not reach (smaller than) the verify voltage. Shaded area 1002 may be indicative of a verify range, i.e., VFC criteria, defined by the verify voltage (e.g., Vth <Vrf). The total number of programmed target memory cells 306 that fail to pass the verification using the verify voltage (i.e., the verification-failed memory cell number) may be represented by the size of shaded area 1002 and the probability density of the threshold voltage distribution. For the same verify voltage, the verification-failed memory cell number may depend on the level of the threshold voltages (e.g., the center of the threshold voltage distribution), which may in turn be affected by the voltage level of the first program voltage. As described above, a smaller first program voltage may result in a narrower final threshold voltage distribution, but at the same time, may cause a larger size of shaded area 1002, i.e., more verification-failed memory cells, which require high power consumption, die size, and verify error rate using the known approach to count each verification-failed memory cells.

Consistent with the scope of the present disclosure, to reduce the number of verification-failed memory cells that need to be actually counted, as shown in FIG. 9, a set of sample voltages, e.g., a first sample voltage Vs1 and a second sample voltage Vs2, may be applied after the verify voltage Vvf in the first program/verify cycle 902 when verifying programmed target memory cells 306. Each sample voltage Vs1 or Vs2 may be a word line voltage pulse signal smaller than the verify voltage, and sample voltages Vs1 and Vs2 may be different from one another, e.g., Vs2 <Vs1 <Vvf. As shown in FIG. 10, by applying the two different first and second sample voltages Vs 1 and Vs2 smaller than the verify voltage Vvf, a portion 1004 of shaded area 1002 may be defined by first and second sample voltages Vs1 and Vs2 in the threshold voltage distribution in the programmed state (e.g., Vs2 <Vth <Vs1). That is, the sample voltages Vs1 and Vs2 may narrow the verify range, i.e., decreasing the VFC criteria. As described below in detail, portion 1004 of shaded area 1002 may be used as a narrower, sample verify range to count a portion of sample verification-failed memory cells, and the resulting smaller, sample verification-failed memory cell number may be used to predict the larger, actual verification-failed memory cell number using a threshold voltage distribution model. It is understood that although FIGS. 9 and 10 show two sample voltages Vs1 and Vs2, in some examples, a single sample voltage Vs may relace the two sample voltages Vs1 and Vs2 for verification. For example, the single sample voltage Vs smaller than the verify voltage Vvf may define a verify range (e.g., Vth <Vs or Vs <Vth <Vvf), which is narrower than the verify range defined by the verify voltage (e.g., Vth <Vvf). In some implementations, the single sample voltage Vs is the upper bound of the sample verify range, meaning that the sample verify range is Vth <Vs.

Referring to FIGS. 3, 5, and 8, to perform the program operation, peripheral circuits 302 can be further configured to obtain the first memory cell number of the programmed row of memory cells 306 based on the sample voltage. The first memory cell number can be the sample verification-failed memory cell number corresponding to the sample verify range (i.e., sample VFC criteria) defined by the sample voltage(s). In some implementations, VFC controller 808 of control logic 512 further sends commands to page buffer/sense amplifier 504 to obtain the sample verification-failed memory cell number. As shown in FIG. 8, page buffer/sense amplifier 504 can include VFC recorder 802 configured to record each time that the threshold voltage of a programmed target memory cell is in a range defined by the sample voltage. The range can be the sample verify range (i.e., sample VFC criteria) defined by one or more sample voltages, such as Vs2 <Vth <Vs1, Vth <Vs, or Vs <Vth <Vvf as described above. In some implementations, VFC recorder 802 includes a set of latches 806, each responsible for recording events according to a certain set of conditions. It is understood that in some examples, a single latch 806 may be used in a time-division multiplexing (TDM) manner to achieve the same function as multiple latches 806. Taking the sample verify range Vs2 <Vth <Vs1 in FIG. 10 as an example, two latches 806 may latch based on the conditions set forth in Table 1 below.

TABLE 1

|  | Latch 1 | Latch 2 |
|---|---|---|
| Vth < Vs2 | 0 | 0 |
| Vs2 < Vth < Vs 1 | 1 | 0 |
| Vth > Vs 1 | 1 | 1 |

As shown in FIG. 8, page buffer/sense amplifier 504 can include VFC counter 804 coupled to VFC recorder 802 and configured to count the number of the recorded times, which is the sample verification-failed memory cell number. Still taking the sample verify range (Vs2 <Vth <Vs1) in FIG. 10 as an example, VFC counter 804 may count the sample verification-failed memory cell number by performing a logic operation following a rule of Latch 1=Latch 1 & (! Latch 2) and label each programmed target memory cell that follows the rule, i.e., Latch 1=1, and Latch=0. Thus, page buffer/sense amplifier 504 can count each programmed target memory cell that has the threshold voltage falls within the sample verify range Vs2 <Vth <Vs1. By reducing the number of verification-failed memory cells to be recorded and counted, the power consumption, die size, and the error rate of page buffer/sense amplifier 504 can be reduced compared with the known approach that needs to count all the verification-failed memory cells.

To perform the program operation, peripheral circuits 302 can be further configured to predict, based on the first memory cell number and the sample voltage, the second memory cell number of the programmed row of memory cells 306 that fail to pass the verification. The second memory cell number can be the total number of verification-failed memory cells, i.e., the actual verification-failed memory cell number corresponding to the full, actual verify range defined by the verify voltage Vth <Vvf. In some implementations, control logic 512 includes VFC predictor 810 configured to obtain a threshold voltage distribution model (VFC model) 812 based on the first program voltage. VFC model 812 can follow a normal distribution. VFC model 812 can be built up based on the silicon test data collected offline and implemented in control logic 512 either as a hardware lookup table (LUT) circuit or as firmware code stored in the RAM of control logic 512. In some implementations, the ratio between the first and second memory cell numbers (e.g., the sample verification-failed memory cell number/the total verification-failed memory cell number) relates to a relationship between the sample voltage and the verify voltage based on VFC model 812. For example, as shown in FIG. 10, the normal distribution of VFC model 812 may reveal (1) the relationship between the size of portion 1004 and the first and second sample voltages Vs1 and Vs2, (2) the relationship between the size of shaded area 1002 and the verify voltage Vvf, (3) the ratio between portion 1004 and shaded area 1002 based on the sample voltages Vs1 and Vs2 and verify voltage Vvf, as well as (4) the probability density. As described above, VFC model 812, e.g., the normal distribution thereof, can be determined by the voltage level(s) of the program voltage(s). Based on the information about the specific first program voltage applied in the program operation, VFC predictor 810 can obtain VFC model 812 corresponding to the specific first program voltage.

In some implementations, VFC predictor 810 of control logic 512 is also configured to receive the information about the first memory cell number (e.g., the sample verification-failed memory cell number) from page buffer/sense amplifier 504 and receive the information about the verify voltage and sample voltage(s) from VFC controller 808. Based on the verify voltage and sample voltage(s) as well as the first memory cell number, VFC predictor 810 can be further configured to estimate the second memory cell number (e.g., the full verification-failed memory cell number) using VFC model 812. For example, the various relationships described above with respect to FIG. 10 as defined by the normal distribution of VFC model 812 may be used by VFC predictor 810 to estimate the full verification-failed memory cell number from the sample verification-failed memory cell.

The predicted second memory cell number (e.g., the full verification-failed memory cell number) can be used for the next program/verify cycle. In some implementations, peripheral circuits 302 can be further configured to program the row of memory cells based on the predicted second number of memory cells using a second program voltage. Control logic 512 can send commands to voltage generator 510 to generate the second program voltage that is greater than the first program voltage and send commands to row decoder/word line driver 508 to apply the second program voltage to selected word line 318 after the first program/verify cycle. As shown in FIG. 9, a second program voltage Vpgm_2 greater than the first program voltage Vpgm_1 may be applied after first program/verify cycle 902. Referring also to FIGS. 3 and 5, when applying the second program voltage, control logic 512 can further send commands to column decoder/bit line driver 506 to select only bit lines 316 that are coupled to the verification-failed memory cells based on the full verification-failed memory cell number. In some implementations, the voltage level of the second program voltage is determined based on the full verification-failed memory cell number as well to ensure that the second program voltage Vpgm_2 is large enough to raise the threshold voltages of all the verification-failed memory cell to or above the verify voltage Vvf, such that another verification after applying the second program voltage Vpgm_2 can be omitted, as shown in FIG. 9, to increase the program speed and decrease the program time.

Figure 11:
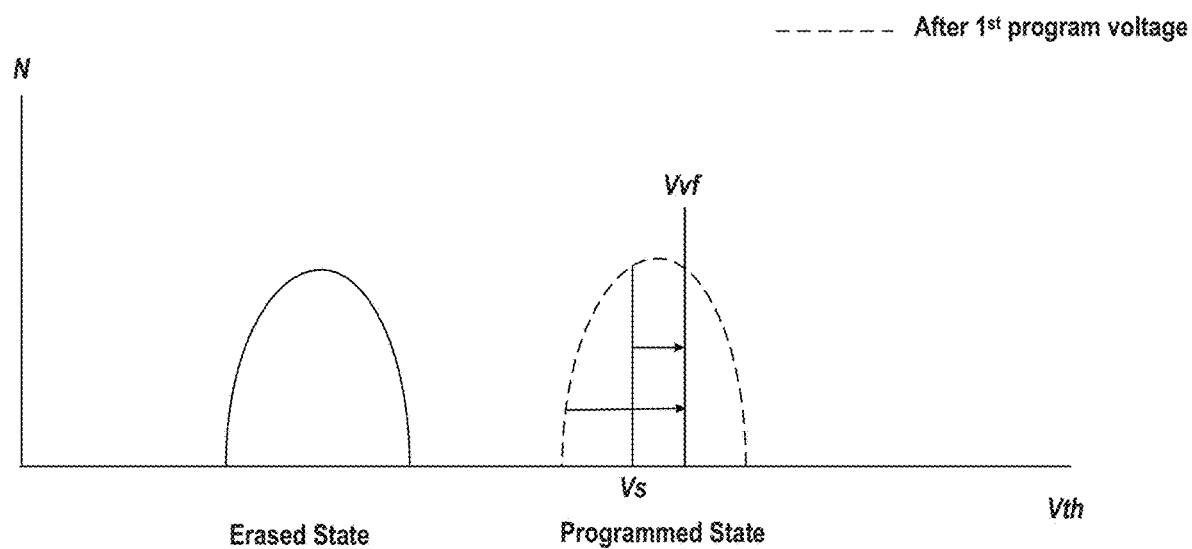
FIG. 11 illustrates threshold voltage distributions of memory cells in another exemplary program operation, according to some aspects of the present disclosure.

It is understood that the way how the subsequent program/verify cycle utilizes the first and/or second memory cell numbers (e.g., the sample and/or full verification-failed memory cell numbers) is not limited by the examples described above. For example, as shown in FIG. 11, two program voltages at different voltage levels (e.g., a stronger program pulse signal and a weaker program pulse signal) may be separately applied to program the verification-failed memory cells. In some implementations, a set of verification-failed memory cells having threshold voltages smaller than the sample voltage Vs (Vth <Vs) is programmed using the stronger program pulse (represented by the longer arrow), while another set of verification-failed memory cells having threshold voltages between the sample voltage Vs and the verify voltage (Vs <Vth <Vvf) is programmed using the weaker program pulse (represented by the shorter arrow).

Figure 12:
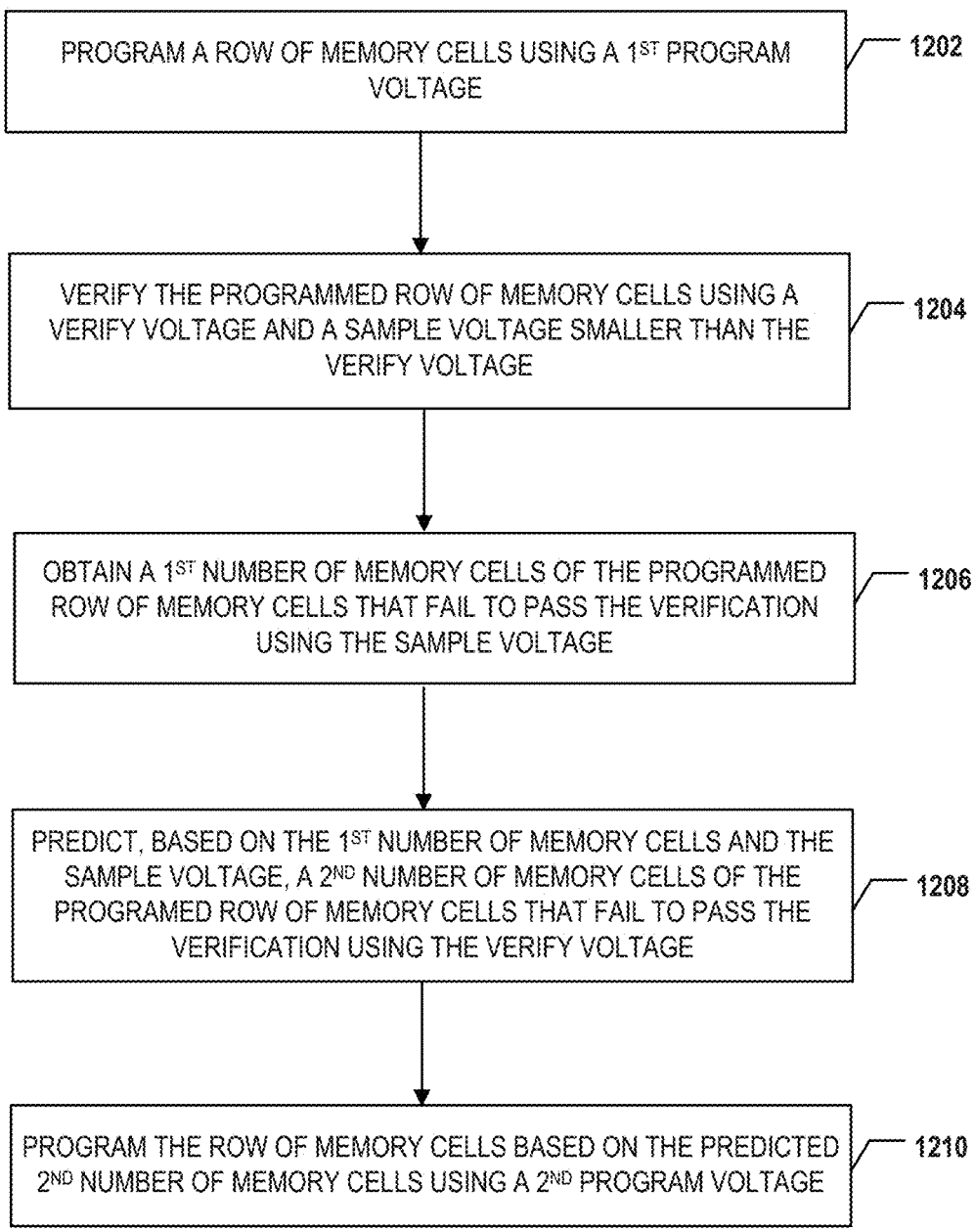
FIG. 12 illustrates a flowchart of an exemplary method for operating a memory device, according to some aspects of the present disclosure.

FIG. 12 illustrates a flowchart of a method 1200 for operating a memory device, according to some aspects of the present disclosure. The memory device may be any suitable memory device disclosed herein, such as memory device 300. Method 1200 may be implemented by peripheral circuit 302, such as row decoder/word line driver 508, page buffer/sense amplifier 504, and control logic 512. It is understood that the operations shown in method 1200 may not be exhaustive and that other operations can be performed as well before, after, or between any of the illustrated operations. Further, some of the operations may be performed simultaneously, or in a different order than shown in FIG. 12.

Figure 13:
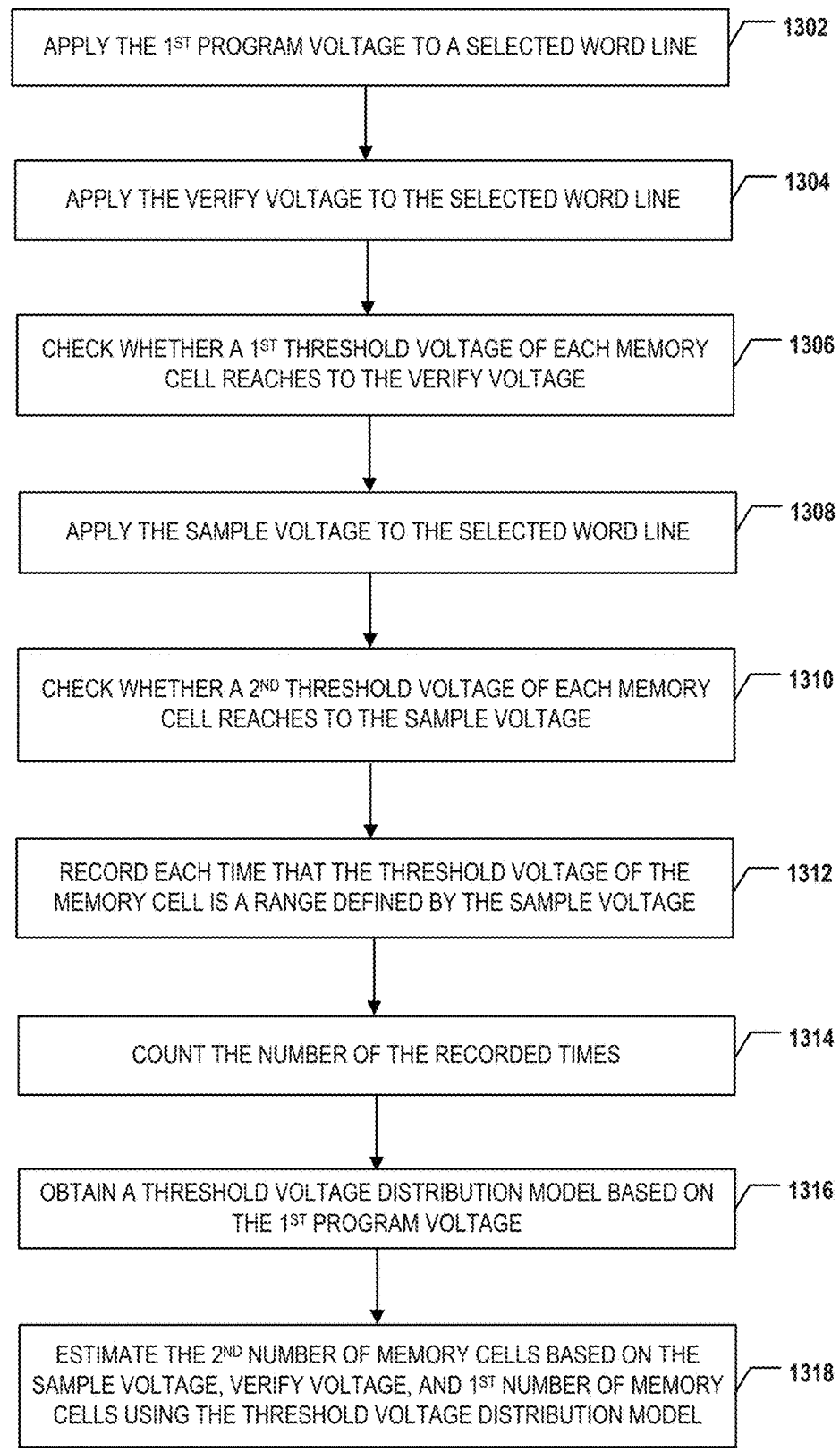
FIG. 13 illustrates a flowchart of another exemplary method for operating a memory device, according to some aspects of the present disclosure.

Referring to FIG. 12, method 1200 starts at operation 1202, in which a row of memory cells of the plurality of rows of memory cells is programmed using a first program voltage. As shown in FIG. 13, at 1302, in some implementations, to program the row of memory cells, the first program voltage is applied to a selected word line coupled to the row of memory cells. For example, in a program operation, row decoder/word line driver 508 may apply a first program voltage Vpgm_1 to selected word line 318 coupled to target memory cells 306.

Method 1200 proceeds to operation 1204, as illustrated in FIG. 12, in which the programmed row of memory cells is verified using a verify voltage and a sample voltage smaller than the verify voltage. The sample voltage can include a first sample voltage and a second sample voltage different from the first sample voltage. As shown in FIG. 13, in some implementations, to verify the programmed row of memory cells, the verify voltage is applied to the selected word line at 1304, and whether a first threshold voltage of each memory cell of the programmed row of memory cells reaches the verify voltage after applying the verify voltage is checked at 1306. In some implementations, to verify the programmed row of memory cells, the sample voltage is then applied to the selected word line at 1308, and whether a second threshold voltage of each memory cell of the programmed row of memory cells reaches the sample voltage after applying the sample voltage is checked again at 1310. For example, in the program operation, row decoder/word line driver 508 may sequentially apply the verify voltage Vvf and one or more sample voltages Vs, or Vs1 and Vs2 to selected word line 318, and page buffer/sense amplifier 504 may sequentially check whether the threshold voltage Vth of each programmed target memory cell 306 reaches the verify voltage and the sample voltage(s), respectively.

Method 1200 proceeds to operation 1206, as illustrated in FIG. 12, in which the first number of memory cells of the programmed row of memory cells is obtained based on the sample voltage. The first number of memory cells can be obtained based on the first and second sample voltages. As shown in FIG. 13, in some implementations, to obtain the first number of memory cells, each time that a threshold voltage of a memory cell of the programmed row of memory cells is in a range defined by the sample voltage is recoded at 1312, and the number of the recorded times is counted. For example, control logic 512 may record each time the threshold voltage Vth of each programmed target memory cell 306 falls within the sample verify range (i.e., meeting the sample VFC criteria) Vs2 <Vth <Vs1, Vth <Vs, or Vs <Vth <Vvf. Control logic 512 may further count the recorded times as the sample verification-failed memory cell number.

Method 1200 proceeds to operation 1208, as illustrated in FIG. 12, in which the second number of memory cells of the programmed row of memory cells that fail to pass the verification is predicted based on the first number of memory cells and the sample voltage. The second number of memory cells can be greater than the first number of memory cells. As shown in FIG. 13, in some implementations, to predict the second number of memory cells, a threshold voltage distribution model is obtained based on the first program voltage at 1316, and the second number of memory cells is estimated based on the sample voltage, the verify voltage, and the first number of memory cells using the threshold voltage distribution model at 1318. The threshold voltage distribution model can follow a normal distribution. A ratio between the first and second numbers of memory cells can relate to a relationship between the sample voltage and the verify voltage based on the threshold voltage distribution model. For example, control logic 512 may obtain VFC model 812 based on the first program voltage Vpgm_1 and estimate the full verification-failed memory cell number based on the verify voltage Vvf, the sample voltage(s) Vs, or Vs1 and Vs2, and the sample verification-failed memory cell number using VFC model 812.

Method 1200 proceeds to operation 1210, as illustrated in FIG. 12, in which the row of memory cells is programmed again based on the predicted second number of memory cells using a second program voltage. For example, in the program operation, row decoder/word line driver 508 may apply the second program voltage Vprgm_2 greater than the first program voltage Vpgm_1 to selected word line 318 to program again the verification-failed memory cells based on the full verification-failed memory cell number.

According to one aspect of the present disclosure, a memory device includes a memory cell array having rows of memory cells, word lines respectively coupled to the rows of memory cells, and a peripheral circuit coupled to the memory cell array through the word lines. The peripheral circuit is configured to program a row of memory cells using a first program voltage and verify the programmed row of memory cells using a verify voltage and a sample voltage smaller than the verify voltage. The peripheral circuit is also configured to obtain a first number of memory cells of the programmed row of memory cells based on the sample voltage. The peripheral circuit is further configured to predict, based on the first number of memory cells and the sample voltage, a second number of memory cells of the programmed row of memory cells that fail to pass the verification.

In some implementations, the sample voltage includes a first sample voltage and a second sample voltage different from the first sample voltage, and the first number of memory cells is obtained based on the first and second sample voltages.

In some implementations, to predict the second number of memory cells, the peripheral circuit comprises control logic configured to obtain a threshold voltage distribution model based on the first program voltage, and estimate the second number of memory cells based on the sample voltage, the verify voltage, and the first number of memory cells using the threshold voltage distribution model.

In some implementations, the threshold voltage distribution model follows a normal distribution.

In some implementations, a ratio between the first and second numbers of memory cells relates to a relationship between the sample voltage and the verify voltage based on the threshold voltage distribution model.

In some implementations, to obtain the first number of memory cells, the peripheral circuit comprises a page buffer configured to record each time that a threshold voltage of a memory cell of the programmed row of memory cells is in a range defined by the sample voltage, and count a number of the recorded times.

In some implementations, the sample voltage is an upper bound of the range.

In some implementations, to program the row of memory cells, the peripheral circuit comprises a word line driver configured to apply the first program voltage to a selected word line of the word lines, the selected word line being coupled to the row of memory cells. In some implementations, to verify the programmed row of memory cells, the word line driver is configured to sequentially apply the verify voltage and the sample voltage to the selected word line, and the peripheral circuit further includes a page buffer configured to sequentially check whether a first threshold voltage of each memory cell of the programmed row of memory cells reaches the verify voltage after the word line driver applying the verify voltage, and whether a second threshold voltage of each memory cell of the programmed row of memory cells reaches the sample voltage after the word line driver applying the sample voltage.

In some implementations, the peripheral circuit is further configured to program the row of memory cells based on the predicted second number of memory cells using a second program voltage.

In some implementations, the second number of memory cells is greater than the first number of memory cells.

According to another aspect of the present disclosure, a system includes a memory device configured to store data and a memory controller coupled to the memory device and configured to control the memory device. The memory device includes a memory cell array having rows of memory cells, word lines respectively coupled to the rows of memory cells, and a peripheral circuit coupled to the memory cell array through the word lines. The peripheral circuit is configured to program a row of memory cells using a first program voltage and verify the programmed row of memory cells using a verify voltage and a sample voltage smaller than the verify voltage. The peripheral circuit is also configured to obtain a first number of memory cells of the programmed row of memory cells based on the sample voltage. The peripheral circuit is further configured to predict, based on the first number of memory cells and the sample voltage, a second number of memory cells of the programmed row of memory cells that fail to pass the verification.

In some implementations, the sample voltage includes a first sample voltage and a second sample voltage different from the first sample voltage, and the first number of memory cells is obtained based on the first and second sample voltages.

In some implementations, to predict the second number of memory cells, the peripheral circuit comprises control logic configured to obtain a threshold voltage distribution model based on the first program voltage, and estimate the second number of memory cells based on the sample voltage, the verify voltage, and the first number of memory cells using the threshold voltage distribution model.

In some implementations, the threshold voltage distribution model follows a normal distribution.

In some implementations, a ratio between the first and second numbers of memory cells relates to a relationship between the sample voltage and the verify voltage based on the threshold voltage distribution model.

In some implementations, to obtain the first number of memory cells, the peripheral circuit comprises a page buffer configured to record each time that a threshold voltage of a memory cell of the programmed row of memory cells is in a range defined by the sample voltage, and count a number of the recorded times.

In some implementations, the sample voltage is an upper bound of the range.

In some implementations, to program the row of memory cells, the peripheral circuit comprises a word line driver configured to apply the first program voltage to a selected word line of the word lines, the selected word line being coupled to the row of memory cells. In some implementations, to verify the programmed row of memory cells, the word line driver is configured to sequentially apply the verify voltage and the sample voltage to the selected word line, and the peripheral circuit further includes a page buffer configured to sequentially check whether a first threshold voltage of each memory cell of the programmed row of memory cells reaches the verify voltage after the word line driver applying the verify voltage, and whether a second threshold voltage of each memory cell of the programmed row of memory cells reaches the sample voltage after the word line driver applying the sample voltage.

In some implementations, the peripheral circuit is further configured to program the row of memory cells based on the predicted second number of memory cells using a second program voltage.

In some implementations, the system further includes a host coupled to the memory controller and configured to send or receive the data.

According to still another aspect of the present disclosure, a method for operating a memory device is provided. The memory device includes a memory cell array having a plurality of rows of memory cells, and a plurality of word lines respectively coupled to the plurality of rows of memory cells. A row of memory cells of the plurality of rows of memory cells is programmed using a first program voltage. The programmed row of memory cells is verified using a verify voltage and a sample voltage smaller than the verify voltage. A first number of memory cells of the programmed row of memory cells is obtained based on the sample voltage. A second number of memory cells of the programmed row of memory cells that fail to pass the verification is predicted based on the first number of memory cells and the sample voltage.

In some implementations, the sample voltage includes a first sample voltage and a second sample voltage different from the first sample voltage, and the first number of memory cells is obtained based on the first and second sample voltages.

In some implementations, to predict the second number of memory cells, a threshold voltage distribution model is obtained based on the first program voltage, and the second number of memory cells is estimated based on the sample voltage, the verify voltage, and the first number of memory cells using the threshold voltage distribution model.

In some implementations, the threshold voltage distribution model follows a normal distribution.

In some implementations, a ratio between the first and second numbers of memory cells relates to a relationship between the sample voltage and the verify voltage based on the threshold voltage distribution model.

In some implementations, to obtain the first number of memory cells, each time that a threshold voltage of a memory cell of the programmed row of memory cells is in a range defined by the sample voltage is recoded, and a number of the recorded times is counted.

In some implementations, the sample voltage is an upper bound of the range.

In some implementations, to program the row of memory cells, the first program voltage is applied to a selected word line of the word lines. In some implementations, to verify the programmed row of memory cells, the verify voltage and the sample voltage are sequentially applied to the selected word line, and whether a first threshold voltage of each memory cell of the programmed row of memory cells reaches the verify voltage after applying the verify voltage, and whether a second threshold voltage of each memory cell of the programmed row of memory cells reaches the sample voltage after applying the sample voltage are sequentially checked.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
   a memory cell array having a plurality of rows of memory cells;
   a plurality of word lines respectively coupled to the plurality of rows of memory cells; and
   a peripheral circuit coupled to the memory cell array through the word lines and configured to:
      program a row of memory cells of the plurality of rows of memory cells using a first program voltage;
      verify the programmed row of memory cells using a verify voltage and a sample voltage smaller than the verify voltage;
      obtain a first number of memory cells of the programmed row of memory cells based on the sample voltage; and
      predict, based on the first number of memory cells and the sample voltage, a second number of memory cells of the programmed row of memory cells that fail to pass the verification.

2. The memory device of claim 1, wherein
   the sample voltage comprises a first sample voltage and a second sample voltage different from the first sample voltage; and
   the first number of memory cells is obtained based on the first and second sample voltages.

3. The memory device of claim 1, wherein to predict the second number of memory cells, the peripheral circuit comprises control logic configured to:
   obtain a threshold voltage distribution model based on the first program voltage; and
   estimate the second number of memory cells based on the sample voltage, the verify voltage, and the first number of memory cells using the threshold voltage distribution model.

4. The memory device of claim 3, wherein the threshold voltage distribution model follows a normal distribution.

5. The memory device of claim 3, wherein a ratio between the first and second numbers of memory cells relates to a relationship between the sample voltage and the verify voltage based on the threshold voltage distribution model.

6. The memory device of claim 1, wherein to obtain the first number of memory cells, the peripheral circuit comprises a page buffer configured to:
   record each time that a threshold voltage of a memory cell of the programmed row of memory cells is in a range defined by the sample voltage; and
   count a number of the recorded times.

7. The memory device of claim 6, wherein the sample voltage is an upper bound of the range.

8. The memory device of claim 1, wherein
   to program the row of memory cells, the peripheral circuit comprises a word line driver configured to apply the first program voltage to a selected word line of the word lines, the selected word line being coupled to the row of memory cells; and
   to verify the programmed row of memory cells, the word line driver is configured to sequentially apply the verify voltage and the sample voltage to the selected word line, and the peripheral circuit further comprises a page buffer configured to sequentially check whether a first threshold voltage of each memory cell of the programmed row of memory cells reaches the verify voltage after the word line driver applying the verify voltage, and whether a second threshold voltage of each memory cell of the programmed row of memory cells reaches the sample voltage after the word line driver applying the sample voltage.

9. The memory device of claim 1, wherein the peripheral circuit is further configured to program the row of memory cells based on the predicted second number of memory cells using a second program voltage.

10. The memory device of claim 1, wherein the second number of memory cells is greater than the first number of memory cells.

11. A system, comprising:
   a memory device configured to store data, the memory device comprising:
      a memory cell array having a plurality of rows of memory cells;
      a plurality of word lines respectively coupled to the plurality of rows of memory cells; and
      a peripheral circuit coupled to the memory cell array through the word lines and configured to:
         program a row of memory cells of the plurality of rows of memory cells using a first program voltage;
         verify the programmed row of memory cells using a verify voltage and a sample voltage smaller than the verify voltage;
         obtain a first number of memory cells of the programmed row of memory cells based on the sample voltage; and
         predict, based on the first number of memory cells and the sample voltage, a second number of memory cells of the programmed row of memory cells that fail to pass the verification; and
   a memory controller coupled to the memory device and configured to control the memory device.

12. A method for operating a memory device, the memory device comprising a memory cell array having a plurality of rows of memory cells, and a plurality of word lines respectively coupled to the plurality of rows of memory cells; the method comprising:
   programming a row of memory cells of the plurality of rows of memory cells using a first program voltage;
   verifying the programmed row of memory cells using a verify voltage and a sample voltage smaller than the verify voltage;
   obtaining a first number of memory cells of the programmed row of memory cells based on the sample voltage; and
   predicting, based on the first number of memory cells and the sample voltage, a second number of memory cells of the programmed row of memory cells that fail to pass the verification.

13. The method of claim 12, wherein
   the sample voltage comprises a first sample voltage and a second sample voltage different from the first sample voltage; and the first number of memory cells is obtained based on the first and second sample voltages.

14. The method of claim 12, wherein predicting the second number of memory cells comprises:
obtaining a threshold voltage distribution model based on the first program voltage; and
estimating the second number of memory cells based on the sample voltage, the verify voltage, and the first number of memory cells using the threshold voltage distribution model.

15. The method of claim 14, wherein the threshold voltage distribution model follows a normal distribution.

16. The method of claim 14, wherein a ratio between the first and second numbers of memory cells relates to a relationship between the sample voltage and the verify voltage based on the threshold voltage distribution model.

17. The method of claim 12, wherein obtaining the first number of memory cells comprises:
recording each time that a threshold voltage of a memory cell of the programmed row of memory cells is in a range defined by the sample voltage; and
counting a number of the recorded times.

18. The method of claim 17, wherein the sample voltage is an upper bound of the range.

19. The method of claim 12, wherein
programming the row of memory cells comprises applying the first program voltage to a selected word line of the word lines, the selected word line being coupled to the row of memory cells; and
verifying the programmed row of memory cells comprises sequentially applying the verify voltage and the sample voltage to the selected word line, and sequentially checking whether a first threshold voltage of each memory cell of the programmed row of memory cells reaches the verify voltage after applying the verify voltage, and whether a second threshold voltage of each memory cell of the programmed row of memory cells reaches the sample voltage after applying the sample voltage.

20. The method of claim 12, further comprising programming the row of memory cells based on the predicted second number of memory cells using a second program voltage.

* * * * *